United States Patent

Halttunen et al.

[11] Patent Number: 5,844,166
[45] Date of Patent: Dec. 1, 1998

[54] LATTICE RF SHIELD

[75] Inventors: Mikko Halttunen, Oulu; Pekka Lonka, Salo, both of Finland

[73] Assignee: Nokia Mobile Phones, Ltd., Salo, Finland

[21] Appl. No.: 907,290

[22] Filed: Aug. 6, 1997

Related U.S. Application Data

[63] Continuation of Ser. No. 490,815, Jun. 15, 1995, abandoned.

[30] Foreign Application Priority Data

Jun. 16, 1994 [FI] Finland .................................... 942863

[51] Int. Cl.$^6$ ...................................................... H05K 9/00
[52] U.S. Cl. ........................ 174/35 R; 361/816; 200/305; 455/300
[58] Field of Search ...................................... 455/300, 301, 455/117, 347; 379/368; 200/DIG. 47, 305; 361/816, 818; 174/35 R, 35 GC, 35 MS

[56] References Cited

U.S. PATENT DOCUMENTS

| | | | |
|---|---|---|---|
| 4,336,529 | 6/1982 | Buan | 364/464.15 |
| 4,931,794 | 6/1990 | Haag et al. | 341/31 |
| 5,083,240 | 1/1992 | Pasco | 362/26 |
| 5,095,177 | 3/1992 | Johnson | 174/35 R |
| 5,128,842 | 7/1992 | Kenmochi | 362/95 |
| 5,265,273 | 11/1993 | Goodwin et al. | 455/347 |
| 5,365,410 | 11/1994 | Lonka | 361/816 |
| 5,400,949 | 3/1995 | Hirvonen et al. | 228/180.22 |
| 5,513,078 | 4/1996 | Komraka et al. | 361/818 |

OTHER PUBLICATIONS

Finnish Office Action and English Translation thereof, dated Mar. 31, 1995, Nokia Mobile Phones Ltd., Application No. 942 863.

*Primary Examiner*—Bot Ledynh
*Assistant Examiner*—Kristina Soderquist
*Attorney, Agent, or Firm*—Perman & Green, LLP

[57] ABSTRACT

In the present invention the cover-like part (21) of an RF shield is manufactured from a transparent material, e.g., plastic, and unplated areas that function as light conductors (22) are left in the conductive plating covering the shield. The present invention combines an RF shield and a light conductor into one structure whose manufacturing process is quite easy to control. The present invention eliminates the necessity of having separate plates that function as light conductors.

9 Claims, 4 Drawing Sheets

LATTICE RF SHIELD

This application is a continuation of application Ser. No. 08/490,815 filed on Jun. 15, 1995, now abandoned.

BACKGROUND OF THE INVENTION

The present invention relates to a radio frequency (RF) shield having a layer comprising an electrically conductive region made from electrically conductive material and a light transmitting region made from light transmitting material.

It is known that a metal or metal-plated, grounded enclosure that both shields a device from interference caused by external electric or magnetic fields and prevents interference caused by the device itself from radiating to its surroundings is used as an interference shield in devices containing electrical components. Especially devices or parts of devices that contain a radio transmitter or operate near a powerful radio transmitter must be shielded from electromagnetic interference caused by radio frequency signals, which may damage the most sensitive electrical components of the device or cause the device to malfunction.

The enclosures of electrical equipment in many consumer products are currently manufactured from plastic or some other similar insulating material. It is advantageous to manufacture the enclosures from plastic, because it is a lightweight material and does not restrict the shape of the enclosure. Radio frequency shielding, or RF shielding, of devices such as mobile phones that are susceptible to radio frequency interference can be implemented by plating the inner surface of the plastic enclosure with a conductive material, for example. Another commonly used shielding method involves insulating the interference-sensitive parts of a device from the parts that cause interference with a separate, conductively plated RF shield installed so as to protect the components on a circuit board. The shape of such an RF shield that is not part of the device enclosure itself can be simple and suited to the given application. It is advantageous to use a separate shield if several differently shaped versions of the device are manufactured. The same RF shield can be used in all the versions.

This type of conductive shield that functions as an RF shield is usually manufactured from plastic by using injection moulding, for example, and conductively plated electrolytically, by vacuum deposition, or by painting it with conductive paint, for example. The plating usually covers both the inner and outer surfaces of the shield. The shield is shaped so as to cover the interference-sensitive or interference-producing electronic circuitry as completely as possible. Input/output devices such as a display, keyboard, microphone or speaker and light sources, usually diodes, are usually placed on separate circuit boards outside the RF shield, or openings are made in the shield to accommodate such devices.

In mobile phones the circuit board outside the RF shield is a flexible, thin membrane that is fastened to the outer surface of the shield and is needed only because of the above-mentioned input/output devices and light sources. A significant part of the circuit board area is consumed by the display, which usually is a liquid crystal display called LCD. A liquid crystal display requires a separate backlight so that characters output by the display are also discernible in the dark. The light is implemented with light-emitting diodes installed near the display. Backlighting can be enhanced with a reflector that can be located on the bottom surface of a transparent plate that functions as a light conductor below the display element, for example. In such a case, the light-emitting diodes that function as a light source are placed at the sides of the transparent plate, whereupon the light conductor transmits the light to the bottom surface of the display both directly and reflected by the reflector.

FIG. 1 shows a cross-sectional view of such a backlit LCD construction. As shown in the figure, a transparent plate 12, which functions as a light conductor, is located underneath the LCD element 11. Light-emitting diodes 13 that illuminate the display 11 are mounted at each side of the light conductor 12 on a membrane-type circuit board 14. The circuit board 14 has an opening the size of the display 11 and the light conductor 12 so that the conductive surface (depicted with heavy lines in the figure of the RF shield 15 can function as a reflector. The reflector can also be implemented with a white reflective tape, for example, that also fastens the bottom surface of the light conductor 12 to the RF shield 15. The RF shield 15 and the circuit board 14 and light conductor 12 located on its surface are shown apart from each other for clarity in FIG. 1. The enclosure of the device is depicted with a dotted line 16. The location of the circuit board 17 inside the RF shield is also shown in the figure.

This type of construction consisting of several layers consumes a lot of space, especially at the location of the display, and restricts the shape of the enclosure of the device. Therefore, in practice, the enclosures of modern, extremely small mobile phones must contain a bulge to accommodate the display. It is especially problematic to line up and fasten the transparent plate functioning as a light conductor underneath the display to the RF shield. It is usually fastened with tape.

SUMMARY OF THE INVENTION

According to the invention there is provided an RF shield having a layer comprising an electrically conductive region made from electrically conductive material and a light transmitting region made from light transmitting material, wherein the light transmitting region permits the passage of light through the layer and the electrically conductive region inhibits the passage of radio frequency radiation through the layer.

An RF shield in accordance with the invention has the advantage that it provides an RF shield that may also function as a light guide.

An RF shield in accordance with the invention also has an advantage that it is possible to realise the liquid crystal display of a device as a smaller unit than in known designs and also solves the problems relating to the mating of the RF shield and the transparent plate that functions as a light conductor.

In accordance with particular embodiments of the invention the RF shield is manufactured from a transparent material, for example, plastic, and includes a conductive plating wherein unplated areas of the RF shield function as light conductors.

In accordance with particular embodiments of the invention the RF shield and the light conductor are formed into a single structure thus eliminating the need for separate light conducting plates. The manufacturing process of the RF shield is simple and easy to control. The areas that are to function as light conductors can be masked with tape or protective lacquer, for example, before plating with a conductive material. The mask is removed after plating, unless clear protective lacquer is used, which does not necessarily have to be removed. The mask prevents the plating from adhering to the areas that are to function as light conductors.

In a first advantageous embodiment in accordance with the invention the LCD element is located on the outer surface of the light conductor belonging to the RF shield described in the present invention and the light-emitting diodes that function as backlights of the display are placed under the LCD element, on a circuit board inside the shield. Key elements can also be illuminated in the same manner. The structure makes it possible to construct a display that requires less space, and with which it is also possible to increase the component density of the circuit board inside the RF shield. Backlighting implemented according to this embodiment reduces the number of components located outside the RF shield in the case of a keyboard, for example, as each key usually requires its own light source, which in the prior art is located on the circuit board in conjunction with the keyboard element. Furthermore, the light source illuminating the keyboard in this embodiment can be optimally placed for lighting, for example, directly beneath the key. This may not be possible if both the key and the light source are located on the same circuit board. In accordance with the invention there exists more freedom to select different kinds and sizes of light sources. In principle, one correctly situated light source will illuminate several keys. This type of structure would be difficult to implement if the light source was placed at the same level and on the same circuit board as the object being illuminated as in prior art structures. Similar benefits are obtained when the apparatus is used to illuminate a liquid crystal display or possibly some other object that requires illumination.

In a second advantageous embodiment in accordance with the invention the LCD element is located in a recess in the RF shield. The RF shield in the vicinity of the recess functions as a light conductor whose bottom surface has a reflective plating. Light-emitting diodes that function as light sources are located at the sides of the recess. The reflective plating can be of the same material as the conductive plating. In this structure the display can be located in the recess in the RF shield, such that the device containing the display can be very thin in construction. The apparatus eliminates the need for an extra transparent plate that functions as a light conductor, reducing the amount of space occupied by the display of the device and simplifying assembly of the device. By placing the light sources that function as backlights on the circuit board inside the RF shield, the component density of the circuit board can be increased and it may be possible to decrease the external dimensions of the device. In some cases, the apparatus in accordance with the invention may completely eliminate the necessity of having a circuit board outside the RF shield, in which case the RF shield can function as the enclosure of the device.

In a third advantageous embodiment in accordance with the invention the RF shield acts as a standard RF or EMC (ElectroMagnetic Compatibility) shield as well as functioning as a light conductor to allow the illumination of, for example, a keypad. Apertures in the conductive layer and clear material in the RF shield within the area of the apertures allows the RF shield to conduct light.

BRIEF DESCRIPTION OF THE DRAWINGS

Embodiment of the invention will now be described, by way of example, with reference to the accompanying drawings, in which.

DETAILED DESCRIPTION OF THE INVENTION

Figure 1:
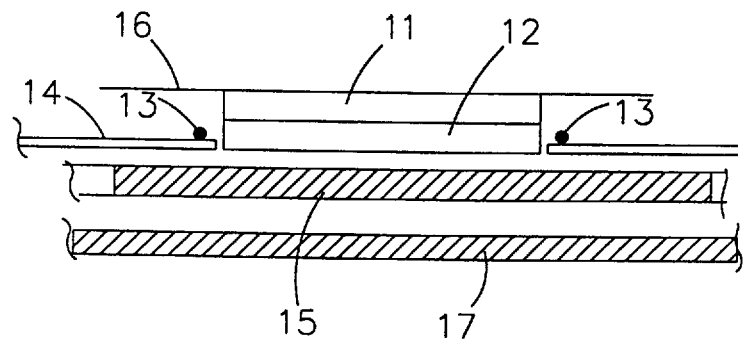
FIG. 1 is a cross-sectional view of a known structure for providing a backlit liquid crystal display and an RF shield.
Figure 2:
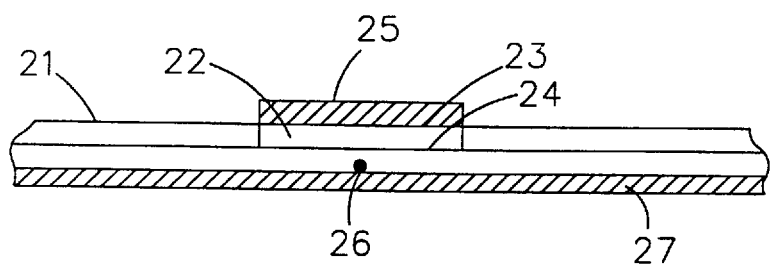
FIG. 2 is a cross-sectional view of an RF shield in accordance with the invention, in which the unplated part functions as a light conductor for the light source which illuminates the display or keyboard.

The known structure shown in FIG. 1 is described in the introductory section. FIG. 2 shows an RF shield 21 in the form of a conductively plated substrate which has an unplated, transparent area on both its inner and outer surfaces that functions as a light conductor 22. The light conductor 22 functions like a window, which naturally allows light to pass through in both directions, from a light source located outside the shield, via the outer surface 23 of the light conductor, and from a light source located inside the shield, via the inner surface 24 of the light conductor. In FIG. 2 the component 25 located on the outer surface 23 of the light conductor 22 can be a display, a keyboard key or some other part of the device that requires backlighting. Light source 26 is located on a circuit board 27 inside the shield 21.

The intensity of the light illuminating the object can be increased with a reflector, which is easy to implement on the surface of the circuit board 27 inside the RF shield 21 in FIG. 2, for example. The light-emitting diodes that function as light sources 26 can be located on top of the reflective surface or at designated, unplated places, if the surface is conductive.

The light conductor in the RF shield described in the present invention can also be used as a display shield, in which case the display is located inside the RF shield in place of the light source 26 shown in FIG. 2. This type of solution is possible with displays that do not require separate backlighting, but which themselves are light sources.

Figure 3:
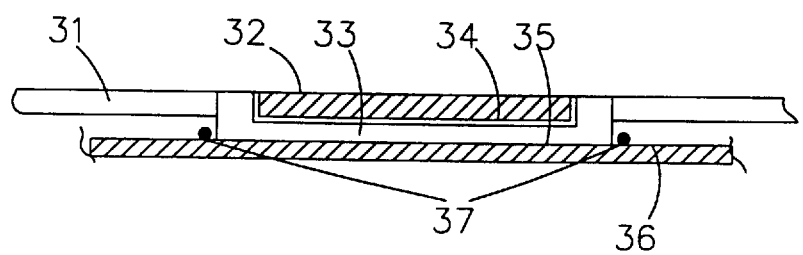
FIG. 3 is a cross-sectional view of an embodiment in accordance with the invention in which the liquid crystal display is located in a recess in the RF shield.

FIG. 3 shows an advantageous embodiment in accordance with the present invention in which a liquid crystal display, reflector and light source can be implemented in a very small space. As shown in this cross-sectional view, the RF shield 31 is in the form of a substrate containing a recess 33 the size of the LCD element 32, the bottom of which is unplated on the outer surface 34, but reflectively plated on the inner surface 35 with the same conductive material as the other parts of the shield. The plating is shown in the figure with a heavy line. The circuit board 36 inside the RF shield is located in close proximity to the inner surface 35 of the depression 33. The light-emitting diodes 37 that illuminate the LCD element 32 can be placed on the circuit board 36 at the sides of the recess 33, whereupon they function to illuminate the bottom surface of the display 32 both directly through the light conductor and reflected from the reflective inner surface 35. In the embodiment described above, a display that contains an LCD element can be made very flat.

The reflective plating material can be selected to determine the colour of the backlight. By using various metals such as aluminium, copper or silver as the reflective plating material, the backlight can be tinted as desired. Another way to effect the colour of the backlight is to manufacture the RF shield from transparent coloured plastic, whereupon the unplated areas will be coloured.

The present invention can be used to implement a structurally simple RF shield that has no extra openings, but still functions as a light conductor. The unplated areas of the shield that function as a light conductor are easy to realise by masking them before the conductive plating is applied end then removing the mask. The mask can be implemented with tape or protective lacquer, for example. Clear protective lacquer does not have to be removed after plating.

Figure 4:
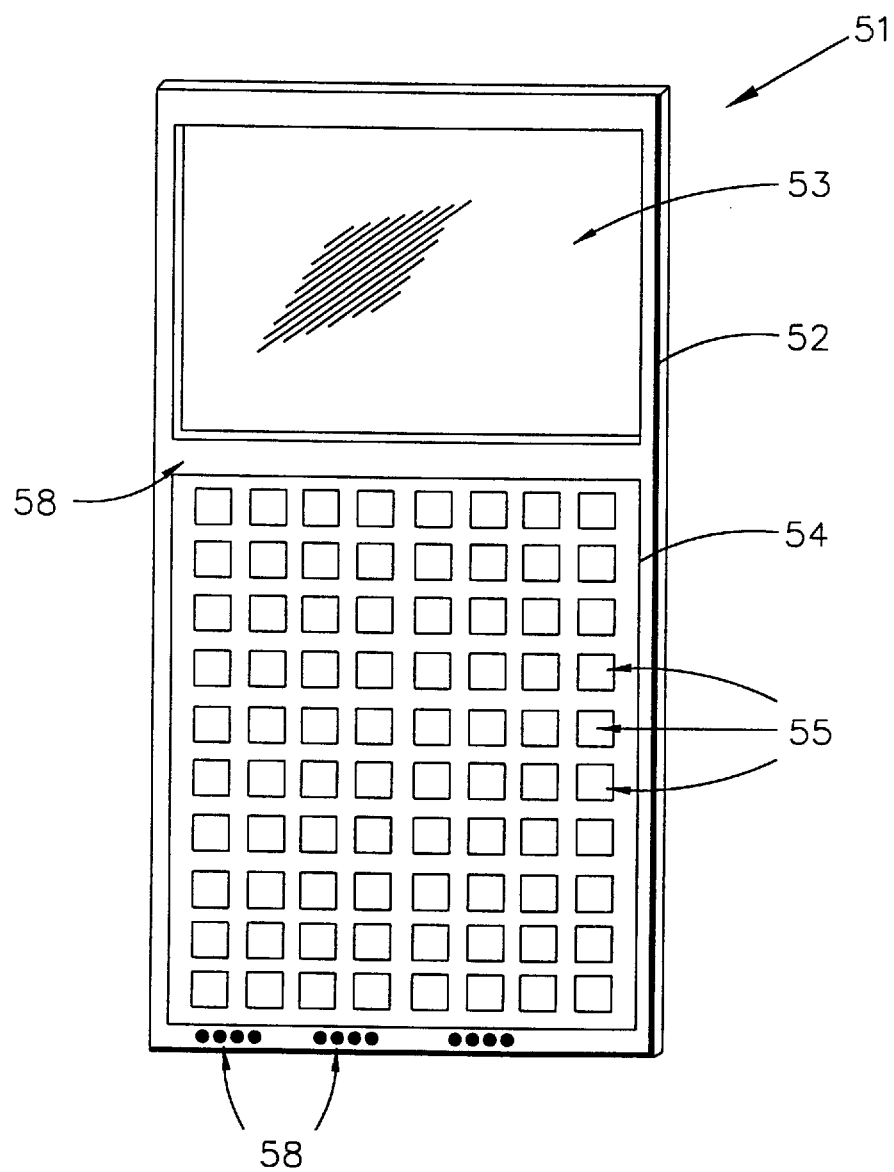
FIG. 4 is a perspective view of an RF shield showing a first major surface.
Figure 5:
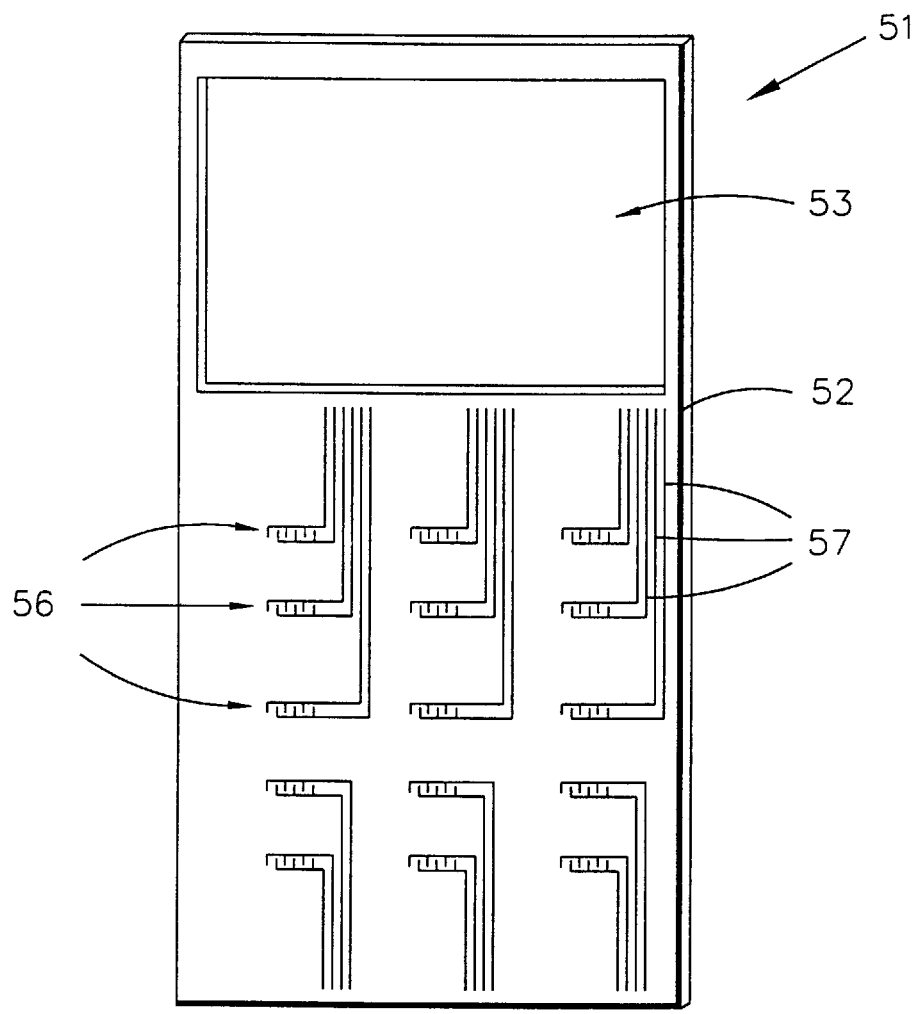
FIG. 5 is a perspective view of the RF shield of FIG. 4 showing a second major surface.

Referring to FIGS. 4 and 5, there is shown an RF shield 51 which can be used in a radiotelephone or in any other suitable electronic apparatus.

The RF shield 51 comprises a generally planar substrate 52 made, for example, of a translucent plastics material. The two major surfaces of the substrate 52 are shown in FIGS. 4 and 5 respectively. Towards one end of the substrate 52 there is a cut away portion forming a rectangular opening 53 through which a display of the radiotelephone can be viewed.

As shown in FIG. 4, the first major surface of the substrate has electrically conductive plating deposited in the shape of a lattice 54. Due to the lattice's shape, visible light is able to pass through apertures 55 of the conductive lattice 54 and continue into the translucent substrate 52. However, the size and density of the apertures 55 is determined such that the passage of interference causing, radio-frequency electromagnetic radiation is substantially attenuated. The ideal dimensions of the apertures 55 depend on the wavelength of radiation which is to be inhibited such that the dimensions are in the order of, or preferably less than, the wavelength of the radiation. For example, when shielding radio frequency radiation of 900 MHz the equivalent wavelength would be ~33 cm. Hence, any aperture substantially less than 33 cm across would be suitable for attenuating such radiation.

Figure 6:
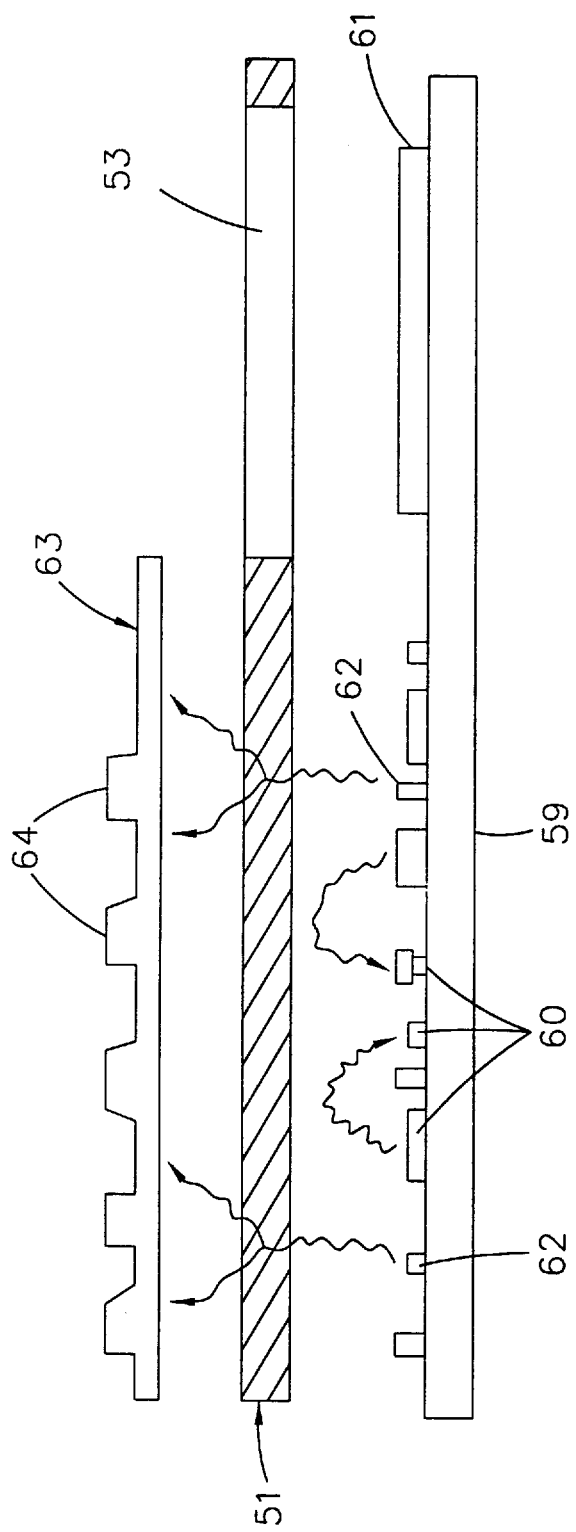
FIG. 6 is a schematic cross-sectional view of the RF shield of FIG. 4 arranged within a radiotelephone.

FIG. 5 shows the second major surface of the substrate, operable as a keypad PCB. The substrate has electrical contacts 56 deposited on its surface which can be activated by suitable keys. Electrically conductive tracks 57 run from the electrical contacts 56 and pass through the substrate 52 to terminals 58 on the first major surface of the substrate 52 (see FIG. 4). Tracks and contacts may also be provided on the substrate 52 for other components such as earphones sockets, buzzers or microphones Referring also to FIG. 6 there is shown a schematic diagram of the RF shield 51 located within a radiotelephone. The RF shield 51 is positioned over the main PCB 59 of the radiotelephone such that the rectangular opening 53 is situated over the display 61 and the remaining portion of the RF shield 51 is situated over the circuitry 60 of the main PCB 59. Fixing of the RF shield 51 to the main PCB 59 may be achieved using screws or rivet nuts. The rectangular opening 53 of the RF shield 51 allows the display 61 to be viewed through the RF shield 51. The first major surface of the substrate is located adjacent to the main PCB 59 and the electrically conductive lattice 54 acts to inhibit the passage of radio frequency radiation emitted from the circuitry 60 of the main PCB 59. Grounding of the conductive lattice is achieved through various spring contacts connecting ground lines of the main PCB 59 to the conductive lattice 54. Above the second major surface of the substrate 52 is positioned the keypad 63 of the radio telephone. The keys 64 of the keypad 63 have electrically conductive actuators which, upon depression of a key 64, provide electrical connection for the electrical contacts 56 of the keypad PCB operable section of the RF shield 51. Connection of the electrical contacts 56 to the main PCB 59 is achieved initially via tracks 57 and subsequently from the terminals 58 on the first side of the substrate via spring contacts to the main PCB 59.

The circuitry 60 of the main PCB 59 includes light emitting diodes 62 (LED's) for illuminating the keypad 63 through the RF shield 51. Light emitted from the LED's 62 passes through the apertures 55 of the electrically conductive lattice 54 and into the translucent substrate 52 of the RF shield 51. As the light passes through the translucent substrate 52 it is diffused slightly and emerges from the substrate 52 to uniformly illuminate the keypad 63.

The present invention is not limited to the above-mentioned examples, but instead can be applied as broadly as the enclosed patent claims allow.

What is claimed is:

1. An RF shielded device having a layer comprising electrically conductive light blocking regions made from electrically conductive material and light transmitting regions made from light transmitting material, wherein the light transmitting regions permit the passage of light through the layer and the electrically conductive regions inhibit the passage of radio frequency radiation through the layer and wherein the light transmitting regions are in the form of a planar substrate and the electrically conductive regions in the form of an electrically conductive plating on the substrate, and wherein situated exclusively on a surface of one of the light transmitting regions of the RF shield is a display.

2. An RF shield as claimed in claim 1, wherein the electrically conductive plating is metallic.

3. An RF shield as claimed in claim 1, wherein the electrically conductive regions are lattice shaped and spaces of the lattice form a plurality of said light transmitting regions.

4. An RF shield as claimed in claim 1, wherein the electrically conductive plating is solid and the light transmitting regions exists at unplated regions.

5. An RF shield as claimed in claim 1, wherein a major surface of the substrate has electric contacts for actuation by keys of a keypad.

6. An RF shield as defined in claim 1 wherein the display is a liquid crystal display.

7. An RF shield as claimed in claim 1 and said display is situated under said one of other light transmitting regions of the RF shield such that the RF shield acts as a window for the display.

8. An RF shielded device having a layer comprising electrically conductive regions made from electrically conductive light blocking material and planar light transmitting regions made from light transmitting material, wherein the light transmitting regions permit the passage of light through the layer and the electrically conductive regions inhibit the passage of radio frequency radiation through the layer and wherein the light transmitting regions are in the form of a substrate and the electrically conductive regions in the form of an electrically conductive plating on the substrate, and wherein situated on a surface of the RF shield is a key of a keypad whereby the RF shield acts as a light guide for transmitting light to illuminate said key of said keypad.

9. An RF shield used with a hand held device having a display, said shield having a layer comprising a lattice of electrically conductive regions made from electrically conductive light blocking material and light transmitting regions made from light transmitting material and defined by apertures in the lattice of the electrically conductive material, said display being situated exclusively on one of the light transmitting regions of said RF shield such that the lattice acts as a light guide for transmitting light to illuminate said display, and wherein the light transmitting regions permit the passage of light through the layer and the electrically conductive regions inhibit the passage of radio frequency radiation through the layer and wherein the display is located coincidentally with a corresponding one of said plurality of said light transmitting regions.

* * * * *